US007744967B2

(12) United States Patent
Gourbesville et al.

(10) Patent No.: US 7,744,967 B2
(45) Date of Patent: Jun. 29, 2010

(54) PROCESS FOR RESURFACING A MONOCRYSTALLINE OR DIRECTIONALLY SOLIDIFIED METALLIC PIECE

(75) Inventors: Olivier Gourbesville, La Celle Saint Cloud (FR); Jean-Pierre Ferte, Corbeil Essonnes (FR); Eric Pinto, Fleury en Biere (FR); Frédéric Braillard, Chatellerault (FR)

(73) Assignees: SNECMA, Paris (FR); SNECMA Services, Paris (FR)

( * ) Notice: Subject to any disclaimer, the term of this patent is extended or adjusted under 35 U.S.C. 154(b) by 747 days.

(21) Appl. No.: 11/213,885

(22) Filed: Aug. 30, 2005

(65) Prior Publication Data
US 2007/0281104 A1 Dec. 6, 2007

(30) Foreign Application Priority Data
Aug. 30, 2004 (FR) .................................. 04 51934

(51) Int. Cl.
*H05H 1/24* (2006.01)
*C23C 14/16* (2006.01)
*B23K 26/00* (2006.01)
*B23K 26/02* (2006.01)

(52) U.S. Cl. .................... 427/597; 427/569; 219/121.6; 219/121.64; 219/121.83

(58) Field of Classification Search ............... 219/121.6, 219/121.64, 121.83; 427/569, 597
See application file for complete search history.

(56) References Cited

U.S. PATENT DOCUMENTS 4,626,653 A * 12/1986 Sciaky et al. ........... 219/121.63
5,059,759 A * 10/1991 Kudo et al. ............. 219/121.78
5,122,632 A    6/1992 Kinkelin
5,866,870 A * 2/1999 Walduck ................. 219/121.45
5,961,861 A * 10/1999 McCay et al. .......... 219/121.83
6,024,792 A * 2/2000 Kurz et al. ...................... 117/9
2003/0213427 A1 11/2003 Betz
2004/0112280 A1  6/2004 Beck et al.

FOREIGN PATENT DOCUMENTS

| EP | 0 740 976 A1 | 11/1996 |
| EP | 1 340 583 A1 | 9/2003 |
| EP | 1 424 158 A1 | 6/2004 |
| EP | 1424158 A1 * | 6/2004 |

OTHER PUBLICATIONS

Li et al. Laser Forming with Constant Line Energy, Jan. 2001, International Journal of Advanced Manufacturing Technology, vol. 17, pp. 196-203.*

* cited by examiner

*Primary Examiner*—Timothy H Meeks
*Assistant Examiner*—Cachet I Sellman
(74) *Attorney, Agent, or Firm*—Oblon, Spivak, McClelland, Maier & Neustadt, L.L.P.

(57) ABSTRACT

A process for resurfacing a monocrystalline or directionally solidified metallic piece, having a thickness ($W_s$), in which a laser beam and a flux of metallic powder, whereof the nature is the same as that of the metallic piece, is applied to the piece to produce at least one layer of metal, monocrystalline or directionally solidified, from the piece, the laser beam being sent out at a power "P", and moving along the piece at a speed "v", wherein the laser beam and the flux of powder are applied coaxially on the piece and the P/v ratio is within the range defined on the figure.

16 Claims, 3 Drawing Sheets

PROCESS FOR RESURFACING A MONOCRYSTALLINE OR DIRECTIONALLY SOLIDIFIED METALLIC PIECE

The invention concerns a process for resurfacing a monocrystalline or directionally solidified metallic piece, having a thickness of less than 2 mm.

Turbine blades are generally made of a monocrystalline or directionally solidified alloy. As a result of local operating conditions and friction to which they are subjected on the walls of the stator relative to which they are placed in rotation, it frequently eventuates that their external end portion becomes worn. It is therefore necessary to "resurface" their end portion, that is, to reconstruct a wall from the worn vertex of the blade.

The U.S. Pat. No. 6,024,792 discloses a process for resurfacing the end portion of the wall of a monocrystalline or directionally solidified piece. In the former, the end of the piece is first preheated, then subjected to a $CO_2$ laser beam perpendicular to its surface and to a flux of metallic powder, projected by a lateral nozzle according to a direction inclined relative to the axis of the laser beam. The latter causes the melting of the powder and the growth of a monocrystalline or directionally solidified metallic layer from the substrate, made up by the initial wall of the blade. Several layers are thus constructed successively. The power of the laser beam is regulated such that it is always in a range of thermal gradient and solidification speed in which the new layer formed is effectively of a monocrystalline or directionally solidified structure, the new grains growing in an epitaxial columnar manner with the grains of the substrate.

Such a process for resurfacing a wall with a piece must be carried out with optimised parameters, with the portion of resurfaced wall having to possess mechanical properties close to those of the base material. For a turbomachine blade, for example, the thickness of the wall is variable, for example between the extrados or the intrados and the trailing edge. It is therefore necessary to adapt the operation of the device to the thickness of the wall during the process.

To date no precise definition of the parameters has been given, nor of the arrangement of the device, for a process for epitaxial homogeneous resurfacing of the wall of a metallic piece, as a function of the thickness of the latter.

The applicant has conducted a series of tests to determine the optimal resurfacing conditions and has thus ended up with the invention, the purpose of which is to improve a process for resurfacing a monocrystalline or directionally solidified piece having a thickness of less than 2 mm.

To this effect, the invention concerns a process for resurfacing a monocrystalline or directionally solidified piece metallic, having a thickness of less than 2 mm, in which a laser beam and a flux of metallic powder, whereof the nature is the same as that of the metallic piece, are applied to the piece to produce at least one layer of metal, monocrystalline or directionally solidified, from the piece, the laser beam being sent out at a power "P" and moving along the piece at a speed "v", characterised in that the laser beam and the flux of powder are applied coaxially on the piece and the P/v ratio is:

for a thickness $W_s$ between 0.2 and 0.6 mm, between two portions of increasing curves, one taking values ranging from 0.12, preferably 0.125, to 0.58, preferably 0.583 $W \cdot min \cdot mm^{-1}$, the other taking values ranging from 0.25 to 0.84, preferably 0.833 $W \cdot min \cdot mm^{-1}$;

for a thickness $W_s$ between 0.6 and 0.8 mm, between two portions of increasing curves, one taking values ranging from 0.58, preferably 0.583, to 0.83, preferably 0.833 $W \cdot min \cdot mm^{-1}$, the other taking values ranging from 0.84, preferably 0.833, to 1.42, preferably 1.417 $W \cdot min \cdot mm^{-1}$;

for a thickness $W_s$ between 0.8 and 1 mm, between two portions of increasing curves, one taking values ranging from 0.83, preferably 0.833, to 1.08, preferably 1.083 $W \cdot min \cdot mm^{-1}$, the other taking values ranging from 1.42, preferably 1.417, to 2.05, preferably 2.042 $W \cdot min \cdot mm^{-1}$;

for a thickness $W_s$ between 1 and 1.2 mm, between two portions of increasing curves, one taking values ranging from 1.08, preferably 1.083, to 1.27, preferably 1.271 $W \cdot min \cdot mm^{-1}$, the other taking values ranging from 2.05, preferably 2.042, to 2.34, preferably 2.333 $W \cdot min \cdot mm^{-1}$;

for a thickness $W_s$ between 1.2 and 1.4 mm, between two portions of increasing curves, one taking values ranging from 1.27, preferably 1.271, to 1.33, preferably 1.333 $W \cdot min \cdot mm^{-1}$, the other taking values ranging from 2.34, preferably 2.333, to 2.48, preferably 2.479 $W \cdot min \cdot mm^{-1}$;

for a thickness $W_s$ between 1.4 and 2 mm, between two portions of increasing curves, the constant one equal to 1.33, preferably 1.333 $W \cdot min \cdot mm^{-1}$, the other taking values ranging from 2.48, preferably 2.479, to 2.75 $W \cdot min \cdot mm^{-1}$.

The applicant has therefore discovered that it was possible to determine a range of values for the P/v ratio, which guarantees correct operating of the process for resurfacing.

Preferably, the portions of curves are portions of straight lines.

According to an embodiment, pre-heating of the piece is carried out prior to the powder flux being applied.

Preferably in this case the pre-heating is carried out by the laser beam.

According to another embodiment, the application of the flux of powder is carried out without pre-heating of the piece.

According to one embodiment, with several layers of metal being successively produced, the energy applied along the piece to all the layers is the same.

According to another embodiment, with several layers of metal being successively produced, the energy of the first layer is less than the energy of the following layers.

Preferably, irrespective of the embodiment selected, the P/v ratio of the layers to which the same energy is applied is equal.

Advantageously, the laser beam is a YAG laser beam.

Advantageously still, the laser beam and the metallic powder are applied by a projection nozzle, comprising a truncated end portion which comprises a central bore for passage of the laser beam and channels, extending in the generation wall of its truncated end, for supplying the powder.

The invention applies in particular to a gas turbine motor blade and to a powder comprising a monocrystalline alloy known as AM1, but the applicant does not intend to limit the scope of its rights to this application.

The invention will be better understood by means of the following description of the preferred embodiment of the process of the invention, with reference to the attached drawings, in which.

The device for carrying out the process for resurfacing of the invention, not shown, mainly comprises an enclosure, a laser source, a powder projection nozzle, fed by a powder distributor and junction bellows between the focussing system, comprising especially the laser source and the nozzle, and the enclosure. The process will be described for the resurfacing of a turbine blade of a gas turbine motor, made of nickel-based alloy, monocrystalline or directionally solidified, but it is understood that it can be applied to any metallic piece comprising a wall to be resurfaced and made up of a monocrystalline or directionally solidified alloy.

Monocrystalline is understood to mean an alloy constituted by a single crystal. Directionally solidified is understood to mean an alloy whereof the crystals extend parallel to one another, in the form of columnar dendrites.

The blade is placed in the enclosure, the vertex of its wall to be resurfaced to the top. The enclosure is constructed of aluminium and is in the form of a parallelepiped whereof the dimensions are 130 mm*130 mm*100 mm. Its internal volume is supplied with argon to establish a neutral atmosphere with a maximum 200 parts per million (ppm) of oxygen, to protect the diverse elements from oxidation. An oxygen analyser is arranged in the enclosure so as to ensure real-time measuring of the concentration of oxygen contained in the enclosure.

The argon is injected via six tubes places at the vertex of the enclosure. In its lower part, the latter comprises a recovery tank for metallic powder, which would not have been fused during the resurfacing of the wall of the blade. A window is set in the front face of the enclosure for a camera to follow the sequence of the process, as well as a thermal control pyrometer.

The blade is here constituted by a Nickel-based alloy, to be referred to here as alloy AM1. This alloy has the following weight composition: Co from 6.0 to 7.0%, Cr from 7.0 to 8.0%, Mo from 1.8 to 2.2%, W from 5.0 to 6.0%, Ta from 7.5 to 8.5%, Al from 5.1 to 5.5%, Ti from 1.0 to 1.4%, Nb, Mn and Si each less than 0.05%, C, B, Cu, P, S, Mg, Sn and Zr each less than 0.01%, Hf and Fe each less than 0.2% and Ni which makes up 100%.

The powder is likewise made of alloy AM1. This is a spherical powder whereof the particles have an average diameter of between 25 and 250 µm. Typically, for a vertex of blade wall made of alloy AM1, particles of average diameter of 63 µm are used, yielding a satisfactory result.

Figure 1:
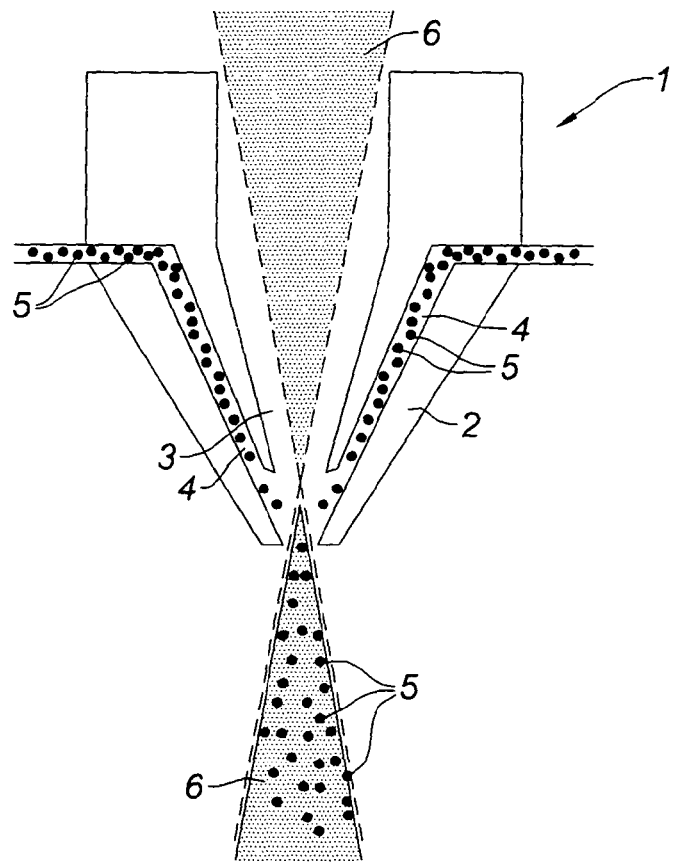
FIG. 1 illustrates a schematic sectional view of the projection nozzle of the device for carrying out the preferred embodiment of the process of the invention.

With reference to FIG. 1, the projection nozzle 1 is positioned at the vertex of the enclosure. It comprises a truncated end portion 2, comprising a central bore 3 and a series of antistatic channels 4 extending into the generation wall of its truncated end 2. The channels are supplied with powder 5, while a rectilinear laser beam 6 spreads inside the central bore. The nozzle is of the type of nozzle described in the patent DE 3935009, to which reference could be made for more details.

The laser beam 6 is produced by a laser source known as YAG. This is a laser whereof the laser medium is constituted by an Aluminium and Yttrium Garnet (YAG), doped with neodymium (Nd). The excitable particles are neodymium ions $Nd^{3+}$. This laser emits a beam having a wavelength of 1064 nm. It emits a continuous energy beam. The guide fibre optic of the beam has a diameter of 0.3 or 0.6 mm, as a function of the geometry of the wall to be resurfaced. For example, a fibre of diameter 0.6 mm enables resurfacing of walls whereof the thickness is between 0.5 and 2 mm. The YAG laser allows thorough interaction between the laser beam 6 and the material, and permits greater manoeuvrability of the projection head, due to the fact of the manoeuvrability of its fibre optic.

The nozzle 1 is connected to one or more of the distributors of alloy powder AM1. The powder 5 is propelled by argon, so as to ensure that it is protected. It is contained in one or more of the reservoirs in which it is mashed so as to remain homogeneous. The gas rate in the distributors is from 1 to 2 l/min and that of the powder from 6 to 8 g/min. At the outlet of the projection nozzle 1, the gas rate is from 5 to 7 l/min.

At the outlet of the nozzle 1 the flux of powder 5 is symmetrical and stable so as to eliminate any irregularity in the resurfacing; the laser beam 6 propagates coaxially with the powder 5. This projection of the powder 5 into the axis of the laser beam 6 enables greater manoeuvrability of the projection nozzle 1, but also greater regularity of the rate and of the fusion phenomenon for resurfacing.

The focussing system, made up especially of the laser source and the nozzle 1, is connected to the enclosure by bellows, whereof the interior is made of glass fibre covered with aluminium, for supporting the reflections of the laser beam 6, and whereof the exterior comprises a silicon coating so as to be protected from possible alterations associated with movements of the ensemble. It is set in motion by a device allowing it to be moved in three perpendicular directions and driven by a device controlled by a program.

The process of the invention will now be described in greater detail, with reference to FIGS. 2 to 5.

A blade 7 is placed in the enclosure of the device. The nozzle 1 is placed above the wall to be resurfaced and projects onto the latter the laser beam 6 and the powder 5. The laser beam is emitted at a power "P" and moves along the wall at a speed "v". The powder 5 is projected into the axis of the laser beam 6.

As a function of the thickness "$W_s$" of the wall, the applicant has discovered that, in order to obtain correct resurfacing, it was necessary to adapt the P/v ratio, by having one or the other of the parameters vary, preferably both of them, and it was found that a range of admitted values could be defined for this ratio. The range of the optimal values for the ratio of the parameters P and v, is defined on the curve of FIG. 3 as a function of the thickness $W_s$ of the wall.

In first approximation by portions of curves, it is can be seen that the P/v ratio must be:

for a thickness $W_s$ between 0.2 and 0.6 mm, between two portions of increasing curves, one taking values ranging from 0.12, preferably 0.125, to 0.58, preferably 0.583 W·min·mm$^{-1}$, the other taking values ranging from 0.25 to 0.84, preferably 0.833 W·min·mm$^{-1}$;

for a thickness $W_s$ between 0.6 and 0.8 mm, between two portions of increasing curves, one taking values ranging from 0.58, preferably 0.583, to 0.83, preferably 0.833 W·min·mm$^{-1}$, the other taking values ranging from 0.84, preferably 0.833, to 1.42, preferably 1.417 W·min·mm$^{-1}$;

for a thickness $W_s$ between 0.8 and 1 mm, between two portions of increasing curves, one taking values ranging from 0.83, preferably 0.833, to 1.08, preferably 1.083

W·min·mm$^{-1}$, the other taking values ranging from 1.42, preferably 1.417, to 2.05, preferably 2.042 W·min·mm$^{-1}$;

for a thickness $W_s$ between 1 and 1.2 mm, between two portions of increasing curves, one taking values ranging from 1.08, preferably 1.083, to 1.27, preferably 1.271 W·min·mm$^{-1}$, the other taking values ranging from 2.05, preferably 2.042, to 2.34, preferably 2.333 W·min·mm$^{-1}$;

for a thickness $W_s$ between 1.2 and 1.4 mm, between two portions of increasing curves, one taking values ranging from 1.27, preferably 1.271, to 1.33, preferably 1.333 W·min·mm–1, the other taking values ranging from 2.34, preferably 2.333, to 2.48, preferably 2.479 W·min·mm$^{-1}$;

for a thickness $W_s$ between 1.4 and 2 mm, between two portions of increasing curves, the constant one equal to 1.33, preferably 1.333 W·min·mm$^{-1}$, the other taking values ranging from 2.48, preferably 2.479, to 2.75 W·min·mm$^{-1}$.

In first approximation, the curves defining the range discovered by the applicant have been defined by portions of increasing curves. The latter have a tangential behaviour, which might be qualified as "smooth", that is, the curves evolve fairly regularly from one portion of curve to the other, without abrupt change in concavity, for example. A method for tracing the curves from data supplied is, for going from a first point to a second, to anticipate the second on the point to follow so as not to have to operate any non-logical change in concavity.

Another approximation can be to take portions of straight lines for the portions of curves as defined hereinabove.

Figure 3:
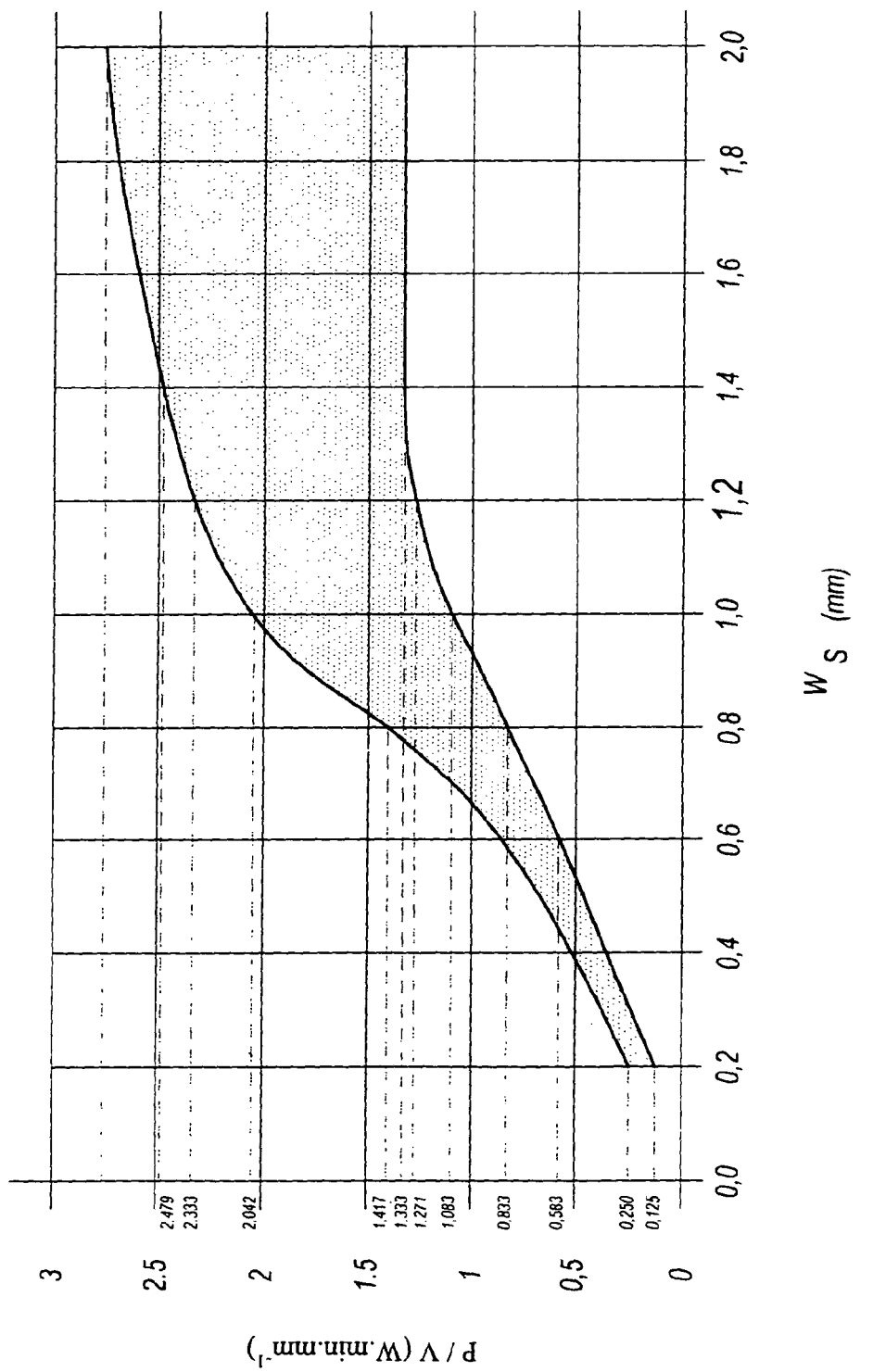
FIG. 3 illustrates a definition curve of the range of values admitted for the ratio of the power of the laser on its runoff speed, relative to the thickness of the wall of the blade, for carrying out the preferred embodiment of the process of the invention.

Accordingly, by respecting the range defined in FIG. 3, the P/v ratio is controlled to the thickness $W_s$ of the wall. This automatic control can be ensured by a program. The evolution of the thickness $W_s$ of the wall of the blade 7 is previously determined and returns to the program. While the process is being run, this program controls the evolution of the ratio P/v as a function of the position of the nozzle 1 along the wall, and therefore the thickness $W_s$ of the latter, as a function of parameters defined by the user, for example the diameter of the fibre optic, the geometry to be given to the resurfacing cordon, the height of the layer to be created, . . . while remaining within the range defined by FIG. 3.

Another possibility is to put in place an auto-regulator device which controls the P/v ratio in real time as a function of a datum, which can be measuring the luminosity of the smelting flux, which depends, indirectly, on the thickness $W_s$ of the wall at any given point. This measuring can be ensured by a photodiode connected to a control system.

By keeping the P/v ratio in the defined range, the action of the laser beam 6 on the powder 5 projected onto the wall causes fusion of the powder and the growth of an alloy; this growth occurs in epitaxial columnar fashion from primary arms of the dendrites contained in the substrate, that is, the vertex of the blade 7, the consequence of which is the solidification of a monocrystalline or directionally solidified metal, according to the nature of the substrate.

Figure 2:
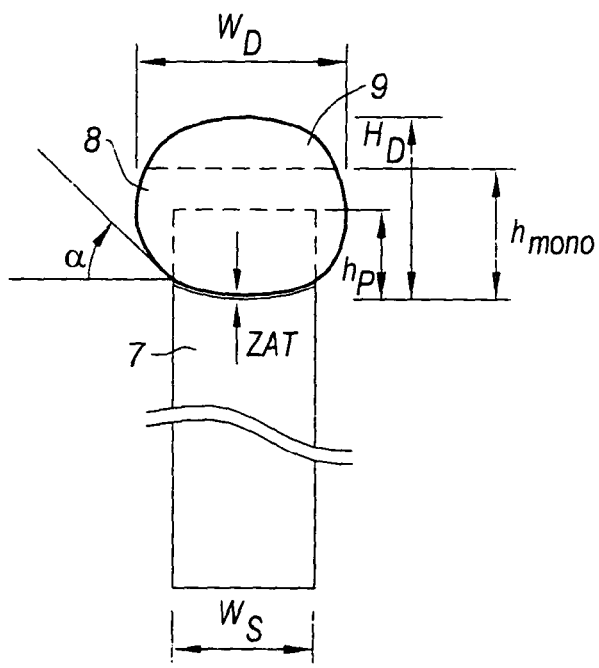
FIG. 2 illustrates a schematic sectional view of the resurfacing of a blade by the preferred embodiment of the process of the invention.

The construction of the first layer metallic 8 is evident from FIG. 2. The diverse parameters are regulated so as fuse the substrate at a height $h_P$ and thus allow solidification of the new layer from the primary arms of its dentrites. The powder 5 is projected so as to obtain a layer 8 of height $H_D$. This layer 8 is formed so that it has a drop profile, whereof the angle α at the base must be between 30 and 70°, so that any machining after the process, known as reworking, to regain a rectilinear wall, is minimal. The maximum width $W_D$ of the drop must be between 110 and 150% of the width $W_s$ of the blade 7, so as to limit reworking.

The height $h_{mono}$ illustrates the height, from the non-fused substrate, on which the drop exhibits monocrystalline solidification or directionally solidified structure. Above this height, the height hood 9 ($H_D$-$h_{mono}$) is not conveniently solidified and will have to be fused during application of the second layer, so that the latter can be done from the primary arms of the columnar dendrites of the first layer 8, and so on for each of the layers.

Due to the process of the invention and to the good choice of the ratio P/v, the zone affected thermally, symbolized by the arrows ZAT on FIG. 2, will be minimal.

In order to resurface the vertex of the blade 7, several layers must be constructed. The process can be implemented, with respect to succession of the layers, according to different embodiments, whereof two will now be described.

In a first embodiment, the energy placed on the first layer 8, depending on the thickness $W_s$ of the wall of the blade 7 during the advance of the nozzle 1 along this wall, is the same as that which is deposited on the following layers. This embodiment is the simplest since only a single power program is necessary to execute it.

In a second embodiment, the energy placed on the first layer 8 is minimised, so as to fuse the substrate at a minimum, then the energy of the following layers is the same for each between them, equal to that of the first layer 8 augmented by 10 to 20%. For the ensemble of the layers, except for the first layer 8, the P/v ratio has the same values along the wall of the blade 7.

Between the formation of each layer, the blade 7 will preferably be cooled to a temperature less than 600°.

In addition, prior to production of the first layer 8, it is possible to pre-heat the substrate, as was customary in the prior art. In this case, the pre-heating can be ensured by the laser beam 6 itself, which can make a first series of passes above the wall of the blade 7, without projecting powder. Homogeneous heating can be guaranteed by playing on the focussing of the laser. The number of passes and the energy contributed will be such as to guarantee minimal pre-heating, though sufficient to limit the fissuring. It can be envisaged to automatically control the system by measuring temperature which, when the consigned temperature is reached, stops the pre-heating phase.

Due to the quality of the choice of its parameters, especially parameters P and v, the process of the invention permits resurfacing of the wall of the blade 7 without pre-heating, which allows a considerable time gain and simplification of the process.

Thermal post-operative treatment is preferably carried out once the ensemble of the layers is constructed, in order to homogenise their structure and allow relaxation of the residual constraints. This treatment will preferably be done between 800 and 1300° C.

By way of example, for a thickness $W_s$ equal to 1 mm, a power P=400 W, with a speed v=250 mm/min, can be selected for the first layer 8, and a power P=500 W, with a speed v=300 mm/min, for all the other layers, for example nine other layers. It is seen that the P/v ratios are well contained in the range of FIG. 3 for the thickness $W_s$=1 mm.

For a thickness $W_s$ equal to 0.5 mm, a power P=125 W, with a speed v=250 mm/min, can be selected for the first layer 8, and a power P=150 W, with a speed v=250 mm/min, for all the other layers.

For this same thickness, a power P=150 W, with a speed v=250 mm/min, can be selected for the first layer 8, and a power P=175 W, with a speed v=250 mm/min, for all the other layers.

Figure 4:
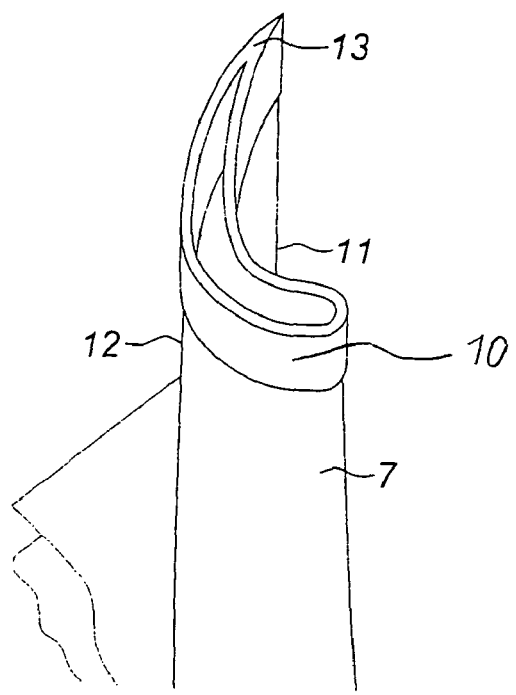
FIG. 4 illustrates a perspective view of a blade resurfaced by the preferred embodiment of the process of the invention.

FIG. 4 shows the blade 7 once the process of the invention is completed, and thermal post-operative treatment and reworking are done. The resulting resurfacing 10 is seen, which extends the wall of the blade 7 on the intrados 11, the extrados 12 and the trailing edge 13. The thicknesses $W_s$ of these different walls are not constant and the process of the invention controls the P/v ratio at their evolution, while ensuring the high quality of resurfacing.

Figure 5:
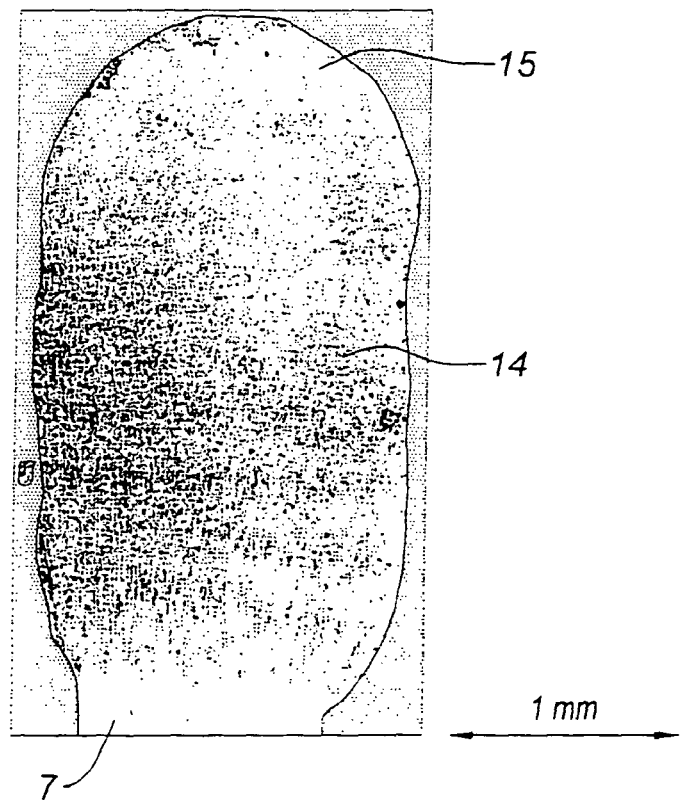
FIG. 5 illustrates a photograph of a sectional view of the resurfacing of the blade of FIG. 4, prior to reworking.

FIG. 5 shows a sectional photograph of the resurfacing 14 of the wall of the blade 7 prior to reworking. It is evident that internal the structure of this resurfacing is columnar dendritic, with the exception of its upper hood 15. It is clear in this figure that two objectives are to be taken into account during definition of the operative parameters: the obtaining of an acceptable microstructure, monocrystalline or directionally solidified, but also the obtaining of good geometry for the drop (for example, if the process is carried out too slowly, the drop risks subsiding and not presenting correct geometry).

Therefore, the invention allows a fully optimised process to be put in place. The specialist has the choice of utilising pre-heating or not, according to the constraints to which it is exerted. The fact of not utilising it, if the constraints are fairly supple, produces a substantial time gain and simplification of the process. The fact of utilising it offers results, which are more precise and more accurate.

The range of parameters which has been defined assures the specialist of the formation of resurfacing whereof the solidification is done in a columnar and epitaxial manner with the dendrites of the primary arms of the substrate, in order to obtain monocrystalline or directionally solidified resurfacing and in such a geometric form as to permit reworking.

The zone affected thermally within the scope of the process is less extended than in the prior art.

The utilisation of a YAG laser with a coaxial nozzle ensures that better laser-material interaction, greater manoeuvrability of the projection head and suppleness of use of the fibre optic accrues.

The invention has been described in relation to a monocrystalline alloy AM1, but it is applied to other types of metals.

The invention claimed is:

1. A process for resurfacing a monocrystalline or directionally solidified metallic piece having a length, a width and a thickness ($W_s$), wherein said thickness, when measured across a side wall of said metallic piece, varies between 0.2 and 2 mm along said width, said process comprising:
   applying coaxially a laser beam and a flux of metallic powder to said side wall of the metallic piece and along said width, wherein the metallic powder is of a same nature as that of the metallic piece, to produce at least one layer of metal, monocrystalline or directionally solidified, on said side wall and along said width of the metallic piece,
   emitting the laser beam at a power "P" and moving said laser beam along the metallic piece at a speed "v", and
   adapting a P/v ratio as a function of said thickness (Ws) of said metallic piece as said laser beam moves along said side wall of said metallic piece at said speed, wherein said adapting of said P/v ratio is performed as follows:
   for a thickness $W_s$ between 0.2 and 0.6 mm, maintaining said P/v ratio between two portions of increasing P/v vs Ws curves, one taking values ranging from 0.12 to 0.58 $W_{mm-1}$, the other taking values ranging from 0.25 to 0.84 $W_{mm-1}$;
   for a thickness $W_s$ between 0.6 and 0.8 mm, maintaining said P/v ratio between two portions of increasing P/v vs Ws curves, one taking values ranging from 0.58 to 0.83 $W_{mm-1}$, the other taking values ranging from 0.84 to 1.42 $W_{mm-1}$;
   for a thickness $W_s$ between 0.8 and 1 mm, maintaining said P/v ratio between two portions of increasing P/v vs Ws curves, one taking values ranging from 0.83 to 1.08 $W_{mm-1}$, the other taking values ranging from 1.42 to 2.05 $W_{mm-1}$;
   for a thickness $W_s$ between 1 and 1.2 mm, maintaining said P/v ratio between two portions of increasing P/v vs Ws curves, one taking values ranging from 1.08 to 1.27 $W_{mm-1}$, the other taking values ranging from 2.05 to 2.34 $W_{mm-1}$;
   for a thickness $W_s$ between 1.2 and 1.4 mm, maintaining said P/v ratio between two portions of increasing P/v vs Ws curves, one taking values ranging from 1.27 to 1.33 $W_{mm-1}$, the other taking values ranging from 2.34 to 2.48 $W_{mm-1}$;
   for a thickness $W_s$ between 1.4 and 2 mm, maintaining said P/v ratio between two portions of increasing P/v vs Ws curves, a constant one equal to 1.33 $W_{mm-1}$, the other taking values ranging from 2.48 to 2.75 $W_{mm-1}$,
   wherein the laser beam and the metallic powder are applied by a projection nozzle, and wherein said adapting of said P/v ratio is performed automatically via a program that includes predetermined information about an evolution of said thickness ($W_s$) along said side wall and that automatically controls said P/v ratio as a function of a position of said nozzle along said side wall of the metallic piece.

2. The process as claimed in claim 1, wherein the portions of P/v vs Ws curves are portions of straight lines.

3. The process as claimed in claim 1, further comprising pre-heating the piece prior to applying the flux of powder.

4. The process as claimed in claim 3, wherein the pre-heating is carried out by laser beam.

5. The process as claimed in claim 1, wherein applying the flux of powder is carried out without pre-heating of the piece.

6. The process as claimed in claim 1, further comprising fabricating successively several layers of metal on top of each other, wherein the energy applied along the metallic piece to all the layers is the same.

7. The process as claimed in claim 6, wherein a same P/v ratio is maintained for the layers to which the same energy is applied.

8. The process as claimed in claim 1, further comprising producing successively several layers of metal on top of each other, wherein the energy of a first layer is less than the energy of subsequent layers.

9. The process as claimed in claim 8, wherein a same P/v ratio is maintained for the layers to which the same energy is applied.

10. The process as claimed in claim 1, wherein the metallic piece and the metallic powder comprise a monocrystalline alloy known as AM1.

11. The process as claimed in claim 1, wherein the laser beam is a YAG laser beam.

12. The process as claimed in claim 1, wherein the laser beam and the metallic powder are applied by a projection nozzle, comprising a truncated end portion which comprises a central bore for passage of the laser beam and channels, extending in the generation wall of its truncated end, for supplying the powder.

13. The process as claimed in claim 1, wherein the metallic piece is a gas turbine motor blade.

14. The process as claimed in claim 1, wherein said adapting of said P/v ratio is performed as follows:

for a thickness $W_s$ between 0.2 and 0.6 mm, maintaining said P/v ratio between two portions of increasing P/v vs Ws curves, one taking values ranging from 0.125 to 0.58 $W_{mm-1}$, the other taking values ranging from 0.25 to 0.833 $W_{mm-1}$;

for a thickness $W_s$ between 0.6 and 0.8 mm, maintaining said P/v ratio between two portions of increasing P/v vs Ws curves, one taking values ranging from 0.583 to 0.83 $W_{mm-1}$, the other taking values ranging from 0.84 to 1.417 $W_{mm-1}$;

for a thickness $W_s$ between 0.8 and 1 mm, maintaining said P/v ratio between two portions of increasing P/v vs Ws curves, one taking values ranging from 0.833, to 1.08 $W_{mm-1}$, the other taking values ranging from 1.42, to 2.042 $W_{mm-1}$;

for a thickness $W_s$ between 1 and 1.2 mm, maintaining said P/v ratio between two portions of increasing P/v vs Ws curves, one taking values ranging from 1.083, to 1.27 $W_{mm-1}$, the other taking values ranging from 2.05 to 2.333 $W_{mm-1}$;

for a thickness $W_s$ between 1.2 and 1.4 mm, maintaining said P/v ratio between two portions of increasing P/v vs Ws curves, one taking values ranging from 1.271 to 1.33 $W_{mm-1}$, the other taking values ranging from 2.34 to 2.479 $W_{mm-1}$;

for a thickness $W_s$ between 1.4 and 2 mm, maintaining said P/v ratio between two portions of increasing P/v vs Ws curves, a constant one equal to 1.333 $W_{mm-1}$, the other taking values ranging from 2.48 to 2.75 $W_{mm-1}$.

15. A process for resurfacing a monocrystalline or directionally solidified metallic piece having a length, a width and a thickness ($W_s$), wherein said thickness, when measured across a side wall of said metallic piece, varies between 0.2 and 2 mm along said width, said process comprising:

applying coaxially a laser beam and a flux of metallic powder to said side wall of the metallic piece and along said width, wherein the metallic powder is of a same nature as that of the metallic piece, to produce at least one layer of metal, monocrystalline or directionally solidified, on said side wall and along said width of the metallic piece, emitting the laser beam at a power "P" and moving said laser beam along the metallic piece at a speed "v", and adapting a P/v ratio as a function of said thickness (Ws) of said metallic piece as said laser beam moves along said side wall of said metallic piece at said speed, wherein said adapting of said P/v ratio is performed as follows:

for a thickness $W_s$ between 0.2 and 0.6 mm, maintaining said P/v ratio between two portions of increasing P/v vs Ws curves, one taking values ranging from 0.12 to 0.58 $W_{mm-1}$, the other taking values ranging from 0.25 to 0.84 $W_{mm-1}$;

for a thickness $W_s$ between 0.6 and 0.8 mm, maintaining said P/v ratio between two portions of increasing P/v vs Ws curves, one taking values ranging from 0.58 to 0.83 $W_{mm-1}$, the other taking values ranging from 0.84 to 1.42 $W_{mm-1}$;

for a thickness $W_s$ between 0.8 and 1 mm, maintaining said P/v ratio between two portions of increasing P/v vs Ws curves, one taking values ranging from 0.83 to 1.08 $W_{mm-1}$, the other taking values ranging from 1.42 to 2.05 $W_{mm-1}$;

for a thickness $W_s$ between 1 and 1.2 mm, maintaining said P/v ratio between two portions of increasing P/v vs Ws curves, one taking values ranging from 1.08 to 1.27 $W_{mm-1}$, the other taking values ranging from 2.05 to 2.34 $W_{mm-1}$;

for a thickness $W_s$ between 1.2 and 1.4 mm, maintaining said P/v ratio between two portions of increasing P/v vs Ws curves, one taking values ranging from 1.27 to 1.33 $W_{mm-1}$, the other taking values ranging from 2.34 to 2.48 $W_{mm-1}$;

for a thickness $W_s$ between 1.4 and 2 mm, maintaining said P/v ratio between two portions of increasing P/v vs Ws curves, a constant one equal to 1.33 $W_{mm-1}$, the other taking values ranging from 2.48 to 2.75 $W_{mm-1}$, wherein said adapting of said P/v ratio is performed by an auto-regulator that controls said P/v ratio in real time as a function of data obtained by measuring in real time a property that depends on said thickness ($W_s$) at any given point along said side wall of said metallic piece.

16. The process as claimed in claim 15, wherein said property is luminosity and said measuring is performed by a photodiode connected to said auto-regulator.

* * * * *